(12) United States Patent
Honma

(10) Patent No.: US 8,693,296 B2
(45) Date of Patent: Apr. 8, 2014

(54) PLL CIRCUIT AND DISK DRIVE

(75) Inventor: Hiromi Honma, Tokyo (JP)

(73) Assignee: NEC Corporation, Tokyo (JP)

( * ) Notice: Subject to any disclaimer, the term of this patent is extended or adjusted under 35 U.S.C. 154(b) by 510 days.

(21) Appl. No.: 12/519,691

(22) PCT Filed: Dec. 4, 2007

(86) PCT No.: PCT/JP2007/073368
§ 371 (c)(1),
(2), (4) Date: Jun. 17, 2009

(87) PCT Pub. No.: WO2008/078512
PCT Pub. Date: Jul. 3, 2008

(65) Prior Publication Data
US 2010/0110848 A1    May 6, 2010

(30) Foreign Application Priority Data

Dec. 22, 2006  (JP) .................................. 2006-345987

(51) Int. Cl.
*G11B 7/00*        (2006.01)

(52) U.S. Cl.
USPC .................. 369/47.28; 369/47.25; 369/124.14

(58) Field of Classification Search
USPC .......... 369/47.48, 59.19, 47.28, 59.21, 44.35, 369/44.29, 44.36, 47.25, 59.2, 124.14
See application file for complete search history.

(56) References Cited

U.S. PATENT DOCUMENTS

| | | | | |
|---|---|---|---|---|
| 5,526,200 A | * | 6/1996 | Yada | 360/51 |
| 5,745,314 A | * | 4/1998 | Ikeda et al. | 360/51 |
| 6,104,682 A | * | 8/2000 | Konishi | 369/44.34 |
| 6,345,018 B1 | * | 2/2002 | Maegawa et al. | 369/44.13 |
| 6,351,164 B1 | * | 2/2002 | Yoshie | 327/156 |
| 2004/0017745 A1 | * | 1/2004 | Wang et al. | 369/47.35 |
| 2005/0073454 A1 | * | 4/2005 | Honma | 341/155 |
| 2006/0052073 A1 | * | 3/2006 | Yoshikawa et al. | 455/180.3 |
| 2007/0121463 A1 | * | 5/2007 | Minemura | 369/59.21 |

FOREIGN PATENT DOCUMENTS

| | | |
|---|---|---|
| JP | 1989277371 A | 11/1989 |
| JP | 1996096516 A | 4/1996 |
| JP | 1997051267 A | 2/1997 |
| JP | 1998154934 A | 6/1998 |
| JP | 2000173194 A | 6/2000 |
| JP | 2005110158 A | 4/2005 |
| JP | 2006216175 A | 8/2006 |

OTHER PUBLICATIONS

International Search Report for PCT/JP2007/073368 mailed Feb. 5, 2008.

* cited by examiner

*Primary Examiner* — Thomas Alunkal
(74) *Attorney, Agent, or Firm* — Sughrue Mion, PLLC

(57) ABSTRACT

A digital loop filter receives a phase error output from a phase comparator to generate a digital frequency value. This digital frequency value is converted into an analog voltage by a D/A converter, and VCO outputs a synchronizing dock of frequency corresponding to the voltage output from the D/A converter. The phase error output from a phase comparator is gain-corrected by a product of an output from the digital loop filter and a specific coefficient "A", and delivered to digital loop filter. The phase error input to the digital loop filter is changed in proportion to the output clock frequency, whereby the PLL loop as whole linearly controls the loop characteristic depending on the output clock frequency.

11 Claims, 12 Drawing Sheets

PLL CIRCUIT AND DISK DRIVE

This application is the National Phase of PCT/JP2007/073368, filed Dec. 4, 2007, which is based upon and claims the benefit of priority from Japanese patent application No. 2006-345987 filed on Dec. 22, 2006, the disclosure of which is incorporated herein in its entirety by reference.

TECHNICAL FIELD

The present invention relates to a PLL circuit and a disk drive and, more particularly, to a PLL circuit that generates a synchronizing timing from an input signal and a disk drive that includes such a PLL circuit.

BACKGROUND ART

Due to recent spread of CDs and DVDs, it is general for an individual person to record a large amount of information on an optical disk medium or reproduce information from the optical disk medium. Minute marks are recorded on the optical disc medium along with a guide groove of a spiral shape formed on the medium. This mark train is obtained by adding error correcting code to digital data including video information or music information, and recorded as 1-bit sequential information modulated by modulation codes.

During reproduction from an optical disc, the optical disc medium is rotated by a spindle motor, and the light emitted from a light source is focused using an objective lens, thereby irradiating a laser spot onto the medium surface. At this moment, a focus-direction actuator is controlled so that the distance between the objective lens and the medium surface is maintained constant, whereas another actuator is also controlled along a radial direction so that the laser spot correctly tracks the guide groove. The reflected light, i.e., laser beam irradiated onto and reflected from the medium surface changes between light and dark due to the presence or absence of the mark on the medium, and is converted by a photodetector into an electric signal (readout signal). Since the readout signal is weak, it is amplified by an amplifier, and subjected to a variety of filtering processings to improve the signal-to-noise ratio of the readout signal.

In order to convert the readout signal into the 1-bit digital information train, it is needed to extract from the readout signal a clock that is in synchrony with the readout signal. This is because a deviation of central axis etc. of the optical recording medium slightly deviates the channel rate of the readout signal even if the rotational speed of the spindle is correctly controlled, to thereby deviate the position to be identified if a fixed-frequency clock timing is employed. Extraction of the clock generally uses a PLL (phase locked loop) circuit. The 1-bit digital information train is obtained by binarizing and extracting the readout signal by using a specific threshold at the synchronized timing output from the PLL circuit. This information train is demodulated, and thereafter subjected to error correction etc. to finally provide the image and/or music information.

FIG. 8 shows the configuration of a typical PLL circuit. The PLL circuit 200 includes, as the basic configuration, three elements including a phase comparator (PC) 202, a loop filter (LPF) 203, and a voltage-controlled oscillator (VCO) 205. In the PLL circuit 200, the phase comparator 202 compares the phase difference between the input signal and an output of the VCO 205, the loop filter 203 removes harmonic components and noise component from the resultant signal of phase comparison, and a feed-back loop is formed wherein the output frequency of the VCO 205 is controlled based on the output from the loop filter 203. Thus, the operation is such that the output of VCO 205 synchronizes with the input signal.

Assuming that the transfer characteristics of the phase comparator 202, loop filter 203 and VCO 205 in the PLL circuit 200 are Kp, F(s) and Kv/s, respectively, the open-loop transfer characteristic G(s) is expressed by the following formula (1):

$$G(s)=Kp \cdot Kv \cdot F(s)/s \quad (1)$$

The closed-loop transfer characteristic H(s) thereof is expressed by the following formula (2):

$$H(s)=G(s)/(1+G(s)) \quad (2)$$

If the G(s) is a first order, there is no frequency pull-in stage, whereby the pull-in range is narrow, and both the quick response and low jitter cannot be satisfied. For this reason, a secondary- or higher-order characteristic is employed. For example, if the F(s) is configured by an adder of an integrator and a first-order LPF, the F(s) is expressed by the following formula (3):

$$F(s)=(\omega_0/s)+\{1/(1+s/\omega_2)\} \quad (3)$$

Further, if Kp and Kv are combined so that:

$$Kp \cdot Kv = \omega_1 \quad (4),$$

the open-loop transfer characteristic is that shown by graph (i) in FIG. 9. The open-loop transfer characteristic assumes −12 dB/Oct. for an angular frequency of below or equal to $\omega_0$ and above or equal to $\omega_2$, and assumes −6 dB/Oct. for an angular frequency of $\omega_0$ to $\omega_2$. In FIG. 9, graph (ii) represents the LPF characteristic whereas graph (iii) represents the VCO characteristic. The response characteristic of the PLL loop is defined by the characteristic angular frequency shown by $\omega_0$, $\omega_1$ and $\omega_2$. A higher value for $\omega_0$ enables tracking of a lower-frequency frequency fluctuation with a reduced error; however, the clock litter increases on the contrary due to an increased noise frequency band that passes through the LPF.

In the mean time, since the optical recording medium is a low-price removable medium, the disk may be involved with a curvature, or may experience a deviation during the chucking thereof. This may sometimes cause the readout signal read from the disk to experience a fluctuation that is in synchrony with the spindle rotation and has a frequency component lower than the channel frequency. In order to reproduce information from such a readout signal, it is needed for the PLL circuit to raise the band of the loop characteristic to some degree, to thereby suppress the frequency fluctuation to a sufficient degree. However, the readout signal has a lower SNR, and if the band is excessively raised, jitter increases due to the noise on the contrary, thereby increasing the possibility of loss of synchronization. In particular, if the data is decoded from information that is recorded with a higher density, the loop characteristic of the PLL circuit used for data reproduction considerably affects the data decoding performance.

Control of disk rotation will be described hereinafter. Control of the disk rotation includes two main types of technique. More specifically there are a CLV (constant linear velocity) control technique that fixes the linear velocity, and a CAV (constant angular velocity) control technique that fixes the rotational angular velocity. Of these techniques, the CLV control is such that the spindle rotational speed is 2.4 times different between the inner periphery and the outer periphery, whereby there arises the problem that a significant waiting time is needed for the spindle control during a random access, and this waists a large amount of electric power. On the other hand, the CAV technique is such that the spindle is rotated at a constant speed, whereby a waiting time is not needed for the rotational speed to thereby improve the accessibility. For this reason, there is an increasing number of apparatuses using the CAV control technique.

During reproducing in a disk drive of the CAV control from a disk on which recording is performed by the CLV control, the synchronizing clock for the readout signal changes about 2.4 times between the inner periphery and the outer periphery, whereby a PLL circuit is needed that has a wide lock-in range and a capture range. On the other hand, the loop characteristic of a typical analog PLL is constant irrespective of the frequency of the input readout signal, due to the configuration of the analog circuit. Accordingly, if the PLL loop characteristic is adjusted in an optimum condition for the inner periphery, the pull-in range is narrower for the outer periphery, to take a long time for the lock-in. On the other hand, if the PLL loop characteristic is adjusted in an optimum condition of the outer periphery, the PLL loop gain is relatively higher during reproducing on the inner periphery, whereby there is a possibility that the clock jitter increases.

In the PLL circuit, if $\omega_1$ is changed without changing the ratio of $\omega_0$ to $\omega_1$ and ratio of $\omega_2$ to $\omega_1$ in the open-loop characteristic shown in FIG. 9, the pull-in characteristic of the PLL can be made comparable only with the time scale being changed, because the dumping coefficient is the same. FIG. 10 shows an idealistic PLL open-loop characteristic during a CAV operation. Graph (iv) and graph (v) in this figure represent the gain during reproducing on the outer periphery and on the inner periphery, respectively. As understood from FIG. 10, the characteristic wherein the PLL characteristic frequency is perfectly linearly shifted along the angular-frequency axis can be realized. Such a characteristic is desirable as the characteristic of the PLL circuit during the CAV reproduction. However, since the passive elements such as C and R determine the loop characteristic in an analog PLL, it is difficult to continuously change the values of these elements. In addition, since there is a temperature dependency and a variation with time, it is difficult to mass-produce PLLs having the same characteristics.

As to a conventional configuration example of the PLL that is scarcely affected by the temperature or variation with time, there is one described in Patent Publication-1. FIG. 11 shows the configuration of the PLL circuit described in Patent Publication-1. The PLL circuit 300 is a typical digital PLL, wherein a phase comparator 302 and a loop filter 303 are digitized. An A/D converter 301 performs A/D conversion of an input signal at the timing of a synchronizing clock output form a VCO 305. The phase comparator 302 compares the digital signal subjected to the A/D conversion against the synchronizing clock output from the VCO 305. The result of phase comparison is input to a D/A converter 304 via a loop filter 303, subjected to D/A conversion in the D/A converter 304, and then input to the VCO 305. The PLL circuit 300 includes a unit that controls the gain of the loop filter 303 in a special range wherein the PLL is subjected to pull-in. This allows the temperature characteristics and the variation with time of the filter section to be disregarded.

As to the correction technique of the PLL loop characteristic, there is a technique described in Patent Publication-2. FIG. 12 shows the configuration of the PLL circuit described in Patent Publication-2. In this PLL circuit 400, an input signal is input to a phase comparator 404, and at the same time input to a F/V converter 401. A/D conversion of an output of F/V converter 401 is performed in an A/D converter 402, whereby the channel frequency is detected in a CPU 403. The CPU 403 switches the characteristic of a loop filter (digital filter) 405 in accordance with the detected channel frequency, and at the same time controls the central frequency of a VCO 406. Control coefficients of the loop filter characteristic for the channel frequency are incorporated in the CPU 403 in the form of a table, whereby an optimum loop characteristic can be realized depending on the linear velocity.

Patent Publication-1: JP-1996-96516A
Patent Publication-2: JP-1989-277371A

Patent Publication-1 has an object to suppress the variation with time by the digitization, and in the configuration thereof, the digitized loop filter is operated with the synchronizing clock of the VCO, whereby the characteristic of the loop filter can be seamlessly changed depending on the oscillating frequency. However, the VCO characteristic cannot be changed, and accordingly, if the PLL characteristic is set optimum in, for example, the middle area for the CAV, and when the PLL is operated for the inner periphery, as shown in FIG. 13, $\omega_0/\omega_1$ assumes a lower value, whereas when the PLL is operated for the outer periphery, as shown in FIG. 14, $\omega_0/\omega_1$ assumes a higher value. More specifically, the dumping coefficient is changed. In this way, Patent Publication-1 cannot realize a seamless correction of the loop characteristic caused by the above change of linear velocity. The graphs in FIGS. 13 and 14 represent similarly to those in FIG. 9.

Although the PLL circuit in Patent Publication-1 includes a unit that controls the gain of the loop filter, this unit is provided for the purpose of achieving a higher-speed pull-in. Although there is a description in Patent Publication-1 that the switching of gain is conducted depending on the state of the input digital signal, a unit for detecting the frequency is not provided therein, whereby the PLL circuit in Patent Publication-1 cannot change the loop gain depending on the frequency. That is, it is impossible to seamlessly correct the gain depending on the CAV linear velocity.

In Patent Publication-2, the A/D converter 402 is needed for detecting the channel frequency, and the CPU 403 is needed for controlling the loop filter. For this reason, there is a problem in the PLL circuit 400 described in Patent Publication-2 that the circuit scale increases and power dissipation also increases. In Patent Publication-2, although the central frequency of VCO 406 is determined based on the output of F/V converter 401, it is needed for the F/V converter 401 to have a higher accuracy. This configuration of the F/V converter 401 cannot achieve a higher accuracy in this case.

SUMMARY OF THE INVENTION

It is an object of the present invention to provide a PLL circuit that can solve the problem in the conventional techniques, can seamlessly correct the loop characteristic in accordance with the change of linear velocity without incurring of the temperature characteristic and variation with time as well as without an increase in the circuit scale.

It is another object of the present invention to provide a disk drive and an optical disk drive that include such a PLL circuit.

The present invention provides, in a first aspect thereof, a PLL circuit that extracts a synchronizing clock from an analog signal in which a channel frequency changes, the PLL circuit including: a phase synchronization loop including: an A/D converter that converts the analog signal into a digital signal, and outputs the same; a digital phase comparator that operates in synchrony with the synchronizing clock to output a phase error signal between the analog signal and the synchronizing clock based on the digital signal output from the A/D converter; a digital loop filter that operates in synchrony with the synchronizing clock to output a digital frequency value proportional to the channel frequency based on the phase error signal; and an oscillator that outputs the synchronizing clock having a frequency controlled based on the digital frequency value; and a loop-gain control unit that controls a loop gain of the phase synchronization loop based on the digital frequency value.

The present invention provides, in a second aspect thereof, a disk drive that reproduces data from a disk based on a CAV control, including: a phase synchronization loop including; an A/D converter that converts into a digital readout signal a readout signal obtained by reading information recorded on the disk; a digital phase comparator that operates based on a synchronizing clock extracted from the readout signal to output a phase error signal between the readout signal and the synchronizing clock based on the digital readout signal; a digital loop filter that operates based on the synchronizing clock to output a digital frequency value in proportion to a channel frequency of the readout signal based the phase error signal; and an oscillator that outputs the synchronizing clock having a frequency controlled based on the digital frequency value; a loop-gain control unit that controls a loop gain of the phase synchronization loop based on the digital frequency value; and a data demodulator that operates based on the synchronizing clock to identify data from the digital readout signal.

The present invention provides, in a third aspect thereof, a disk drive that records data on an optical disk based on a CAV control, including: a phase synchronization loop including: an A/D converter that converts into a digital wobble signal a wobble signal that is read from a wobble component of a guide groove formed on the disk; a digital phase comparator that operates based on a clock extracted from the wobble signal to output a phase error signal between the wobble signal and a synchronizing clock based on the digital wobble signal; a digital loop filter that outputs a digital frequency value that is in proportion to a frequency of the wobble signal; an oscillator that outputs the synchronizing clock having a frequency controlled based on the digital frequency value, the phase synchronization loop multiplying the clock signal to generate a recording clock; and a loop-gain control unit that controls a loop gain of the phase synchronization loop based on the digital frequency value.

The above and other objects, features and advantages of the present invention will be more apparent from the following description, referring to the accompanying drawings.

BEST MODE OF CARRYING OUT THE INVENTION

Figure 1:
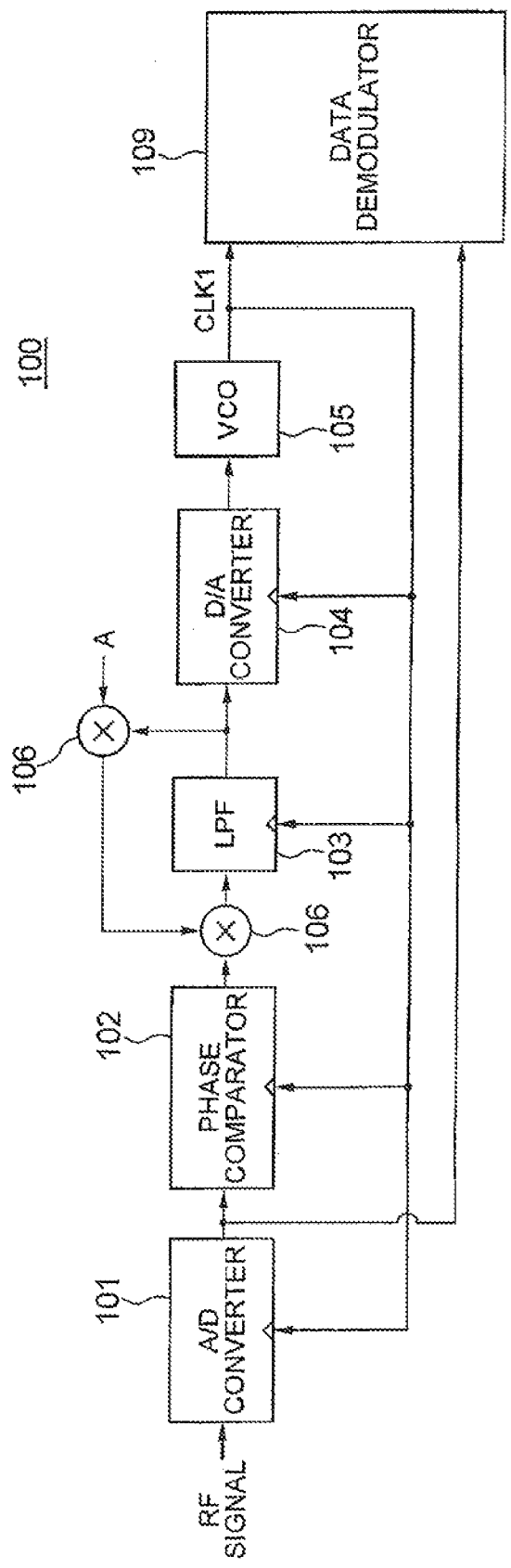
FIG. 1 is a block diagram showing the configuration of a digital PLL circuit according to a first embodiment of the present invention.

Hereinafter, embodiments of the present invention will be described in detail with reference to the drawings. For the sake of easy understanding, similar constituent elements are designated by similar reference numerals in these drawings. FIG. 1 shows the configuration of a data read-out circuit portion of a disk drive according to a first embodiment of the present invention, wherein the configuration of a digital PLL circuit according to a first exemplary embodiment of the present invention is depicted together with a data demodulator 109 that receives synchronizing signals from the digital PLL to demodulate reproduced data. The PLL circuit 100 includes an A/D converter 101, a phase comparator 102, a digital loop filter 103, a D/A converter 104, and a VCO 105. The RF signal that is an input signal is subjected to band-limiting beforehand by an anti-aliasing filter such that the band thereof is equal to or below half the sampling clock of the A/D converter 101. The RF signal input to the PLL circuit 100 is converted into a digital signal by the A/D converter 101.

The phase comparator 102 generates a phase error of the RF signal with respect to the synchronizing clock output from the VCO 105, based on the digital signal input from the A/D converter 101. The phase error signal output from the phase comparator 102 is input to the digital loop filter 103 after a gain correction by a multiplier 106. The digital loop filter 103 generates a digital frequency value that is proportional to the channel frequency based on the input signal. This digital frequency value is converted into an analog frequency signal by the D/A converter 104, and input to the VCO 105. The VCO 105 controls the frequency of the output synchronizing clock CLK1 depending on the input analog frequency signal.

In the PLL circuit 100, operation of the A/D converter 101, phase comparator 102, digital loop filter 103 and D/A converter 104 at the timing of the synchronizing clock CLK1 output from the VCO 105 causes formation of a phase synchronization loop. In addition, the digital frequency value output from the digital loop filter 103 is multiplied by a specific coefficient "A" in a multiplier 106, and the digital frequency value thus multiplied by "A" is multiplied in another multiplier 106 by the phase error output from the phase comparator 102, and then input to the digital loop filter 103. The gain-correction of output of the phase comparator 102 by using the multiplier 106 can seamlessly change the loop gain of the PLL circuit 100 in proportion to the channel clock frequency. In the PLL circuit 100, the portion thereof that adjusts the gain of input of the digital loop filter 103 by using the multiplier 106 corresponds to the loop-gain control unit.

In the configuration of the PLL circuit 100 wherein the output of phase comparator 102 is proportional to the input amplitude, the loop gain changes depending on the input amplitude. In order to prevent this phenomenon, an AGC (auto gain controller) may be provided between the A/D converter 101 and the phase comparator 102, wherein the AGC controls so that the signal input to the phase comparator 102 has a fixed amplitude. In an alternative, the gain adjustment may be performed with respect to the analog signal input to the A/D converter 101, to thereby fix the amplitude of input of the phase comparator 102. Or else, a different configuration may be employed wherein the total loop gain is not changed depending on the input amplitude.

Figure 2:
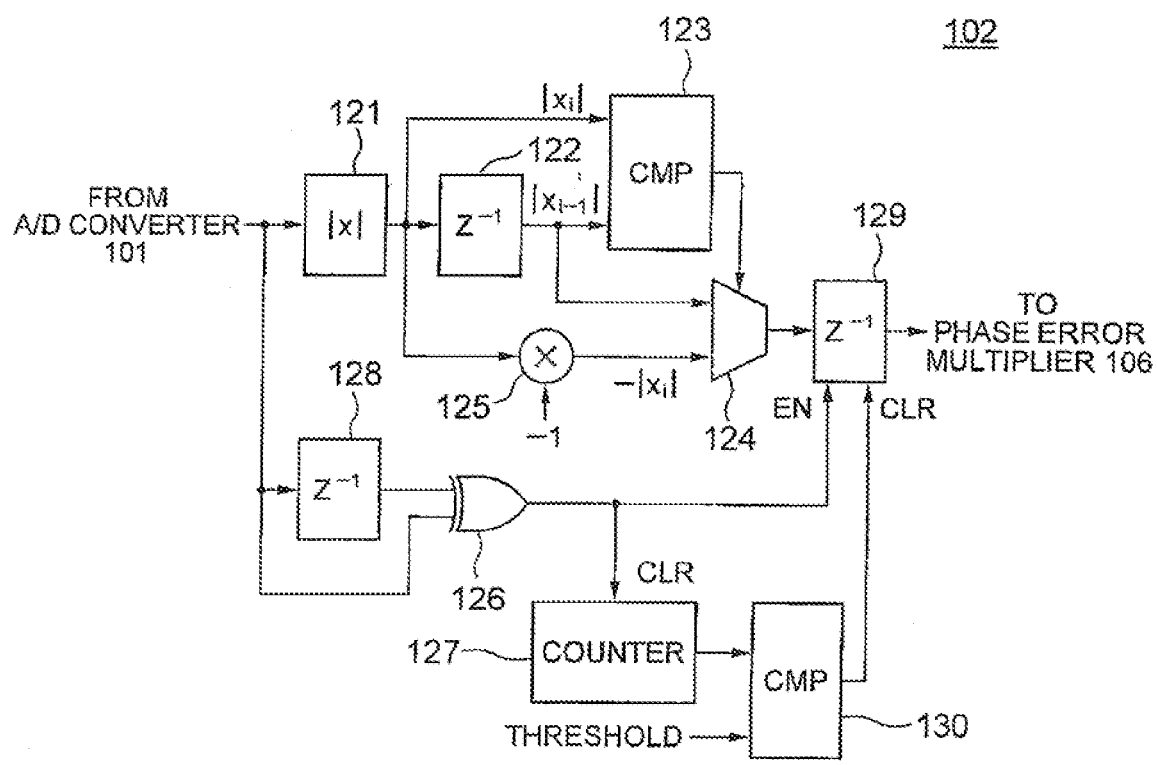
FIG. 2 is a block diagram showing the configuration of the phase comparator.

FIG. 2 shows the configuration of the phase comparator 102. The phase comparator 102 detects the change timing of polarity based on the digital signal train input from the A/D converter 101, to generate a phase error from the amplitude of the digital signal at that timing. The absolute value of the digital signal input to the phase comparator 102 is calculated by an absolute-value calculator 121. A latch circuit (delay unit) 122 operates based on the synchronizing clock output from the VCO 105 (FIG. 1), and delivers the absolute value output from the absolute-value calculator 121 after delaying the same by one clock of the synchronizing clock.

The comparator 123 compares the absolute value $|X_i|$ output from the absolute-value calculator 121 against the absolute value $|X_{i-1}|$ one clock before output from the latch circuit 122. A selector 124 receives a value $(-|X_i|)$ obtained by multiplying the absolute value $|X_i|$ output from the absolute-value calculator 121 by "−1" in a multiplier 125, and the absolute value $|X_{i-1}|$ one clock before output from the latch circuit 122. The output from the selector 124 is determined based on the result of comparison in the comparator 123, whereby the selector 124 outputs $|X_{i-1}|$ if $|X_i|>|X_{i-1}|$, and outputs $-|X_i|$ if $|X_{i-1}|>|X_i|$.

On the other hand, the latch circuit 128 receives a bit representing the sign of the digital signal input to the phase comparator 102. The latch circuit 128 operates based on the synchronizing clock, and outputs the input sign bit after delaying the same by one clock. An exclusive OR 126 receives the sign bit of the current digital signal and the sign bit one clock before input via the latch circuit 128. The exclusive OR 126 detects the time instant at which the sign is inverted, i.e., the edge of the input signal by calculation of an exclusive OR of the sign of the input current digital signal and the sign of the input digital signal one clock before. The output of exclusive OR 126 is used as an enable signal EN for the latch circuit 129, whereby the latch circuit 129 latches the output of selector 124 in accordance with the synchronizing clock CLK1 when the enable signal EN is at a H-level, i.e., at the timing of the edge of input signal.

The selector 124 outputs the data corresponding to a smaller one of the sample values of input signal in the absolute value of the amplitude thereof at the present time and one clock before. Since the latch circuit 129 latches the output of selector 124 at an edge timing, the data latched by the latch circuit 129 is a data corresponding to a smaller absolute value of the amplitude of sampled values of the input signal before and after the edge. Since there occurs no sign inversion in the input digital at the timing other than the edge, the signal level of output signal (enable signal EN) of the exclusive OR 126 is a L-level, and the latch circuit 129 holds the latched data until the enable signal EN assumes a H-level at the succeeding edge. The phase comparator 102 delivers the output of latch circuit 129 as a phase error.

The reason for holding the phase error in the latch circuit 129 at the timing other than the edge as described above is that the readout signal from the optical disc includes a variety of mixed frequencies, and the PLL loop characteristic is changed by the frequency of phase comparison if an ordinary PLL circuit is used, for the phase synchronization. Holding of the phase error in the latch circuit 129 enables prevention of a change of the PLL loop characteristic. However, there is a possibility that if an input signal is interrupted during data reproduction due to a defect etc., and thus the phase error in the preceding stage is maintained as it is for a long time, the oscillation frequency of the VCO 105 is significantly disturbed whereby a longer time length may be needed for establishing the synchronization after the input signal is recovered. For preventing this phenomenon, a counter 127 is used to measure a time interval of edge detection, judge whether or not the edge interval exceeds a specific threshold, and if the edge interval exceeds the threshold, a clear signal is input to the latch circuit 129 to allow the latch circuit 129 to clear the data held therein.

Figure 3:
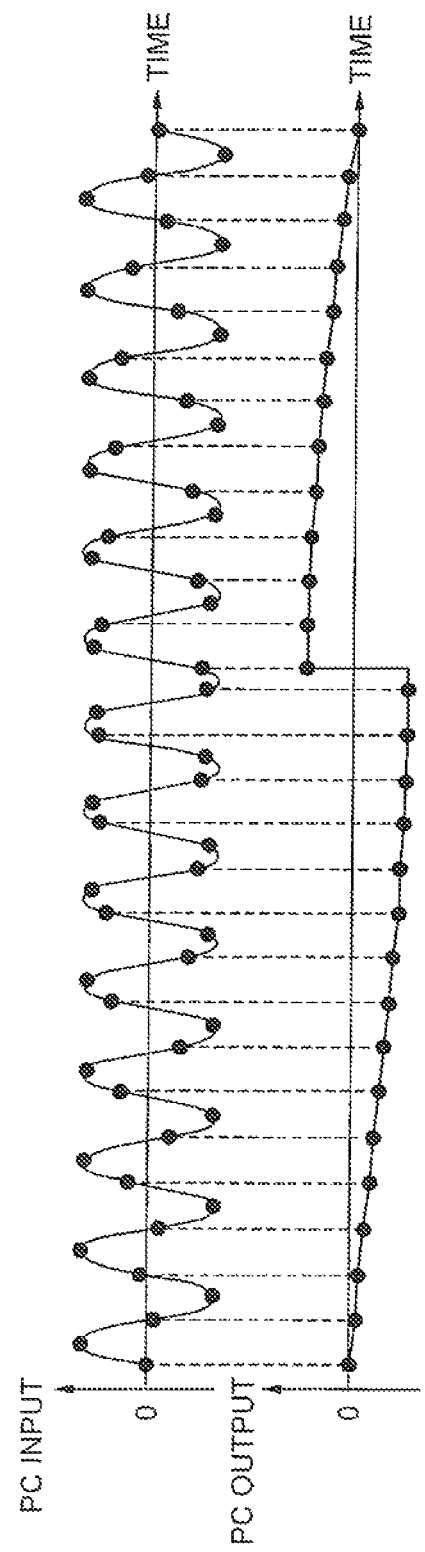
FIG. 3 is a waveform diagram showing an output waveform of the phase comparator upon input of a signal including continued 2T-long mark/space signals.

FIG. 3 shows the output waveform when 2T-long mark/space signals are continuously input to the phase comparator 102. Dots on the input signal represent sampling points of A/D conversion. The phase comparator 102 performs sign correction of the amplitude in the vicinity of an edge from the sampled input signal train, and delivers the same. As depicted in the drawing, when the phase difference reaches −π, the detection range covers ±π so that the phase difference returns to +π. The phase comparator 102 has a detection range of ±π in this configuration; however, it may have the configuration of a phase frequency comparator having a wider range.

Figure 4:
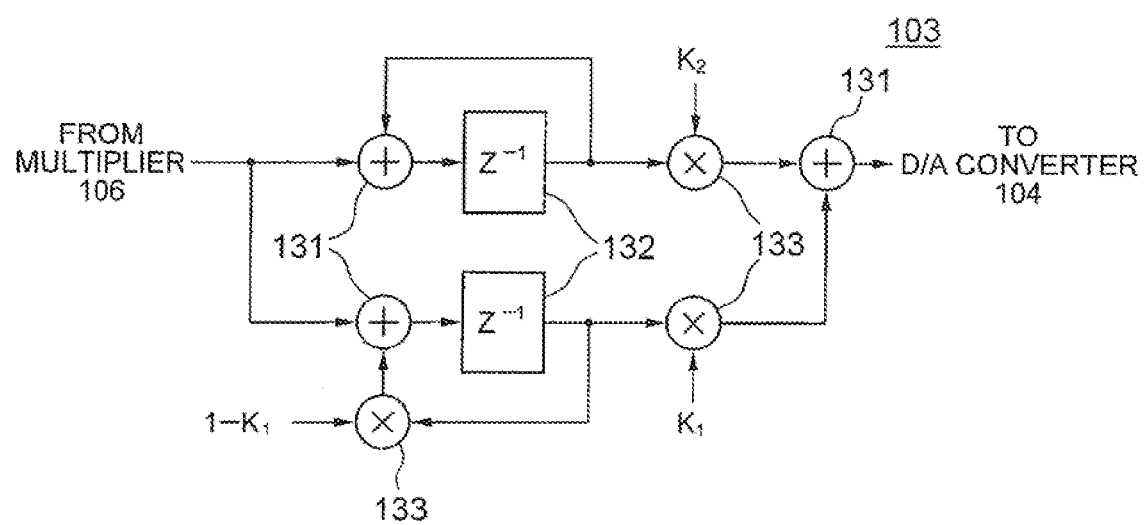
FIG. 4 is a block diagram showing the configuration of the digital loop filter.

FIG. 4 shows a configuration of the digital loop filter 103. The digital loop filter 103 includes an adder 131, a delay unit (latch circuit) 132 that delays the output by one clock cycle, and a multiplier 133. Assuming that $z=\exp(j\omega T)$ where T is the operation period of the digital circuit, the digital loop filter 103 having the configuration shown in FIG. 4 has the following transfer function $F(z)$:

$$F(z)=\{K_2 Z^{-1}/(1-Z^{-1})\}+K_1 Z^{-1}/\{1-(1-K_1)Z^{-1}\} \qquad (5).$$

Figure 9:
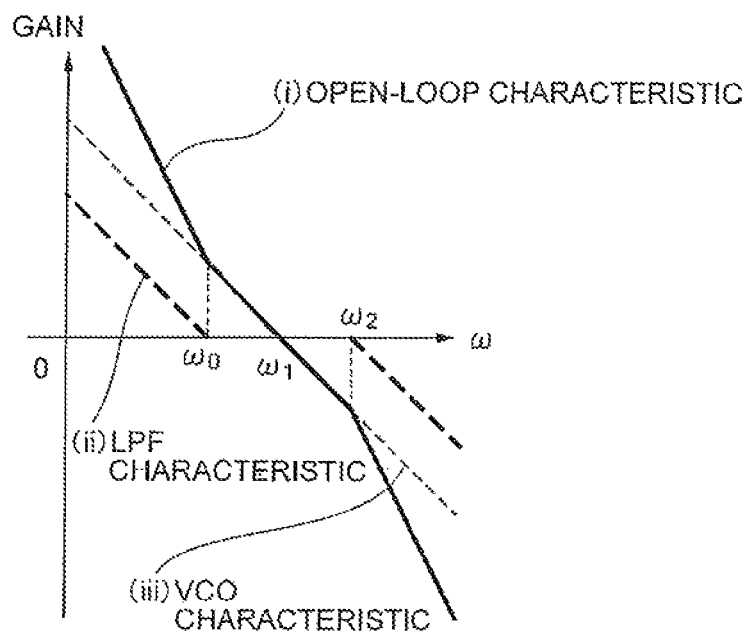
FIG. 9 is a graph showing the PLL open-loop characteristic in the case of using integration characteristic plus first-order low-pass characteristic as the loop filter.
Figure 10:
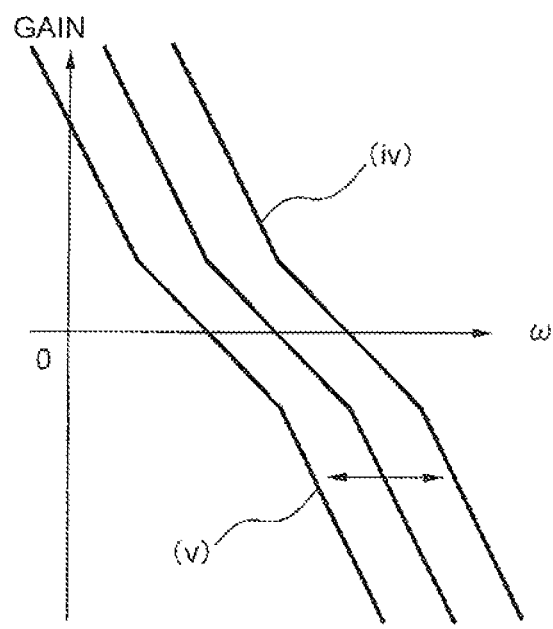
FIG. 10 is a graph showing an ideal PLL open-loop characteristic during a CAV operation.
Figure 11:
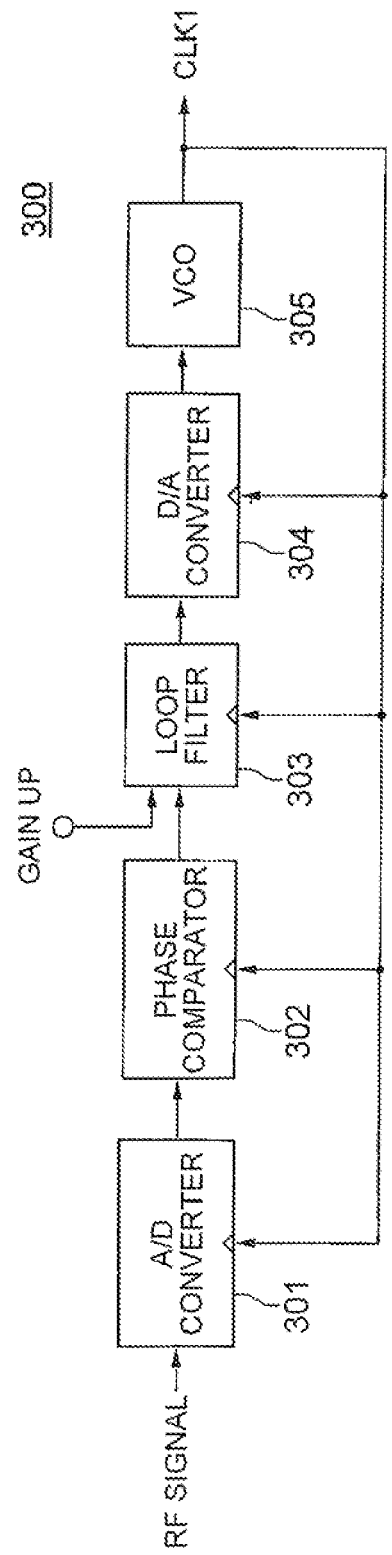
FIG. 11 is a block diagram showing the configuration of the PLL circuit described in Patent Publication-1.
Figure 12:
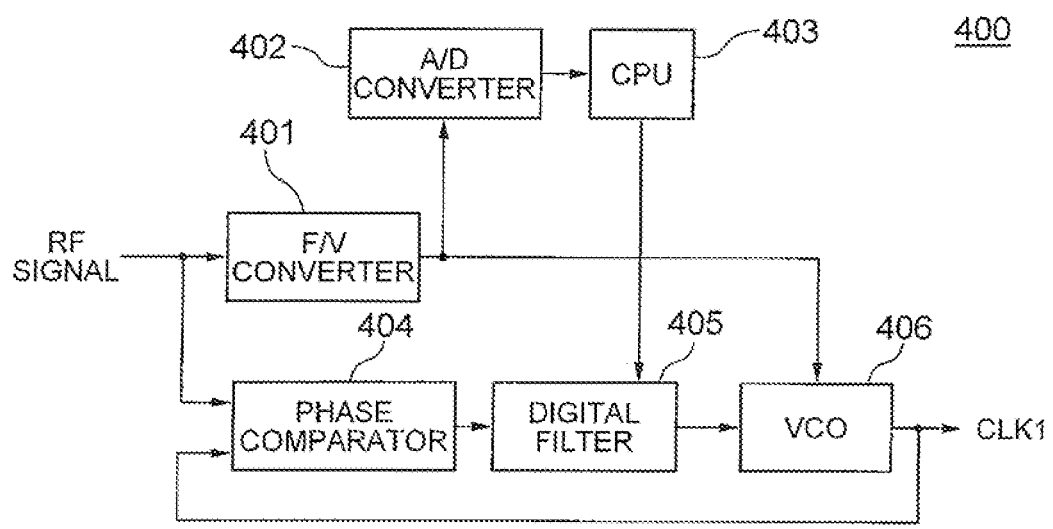
FIG. 12 is a block diagram showing the configuration of the PLL circuit described in Patent Publication-2.
Figure 13:
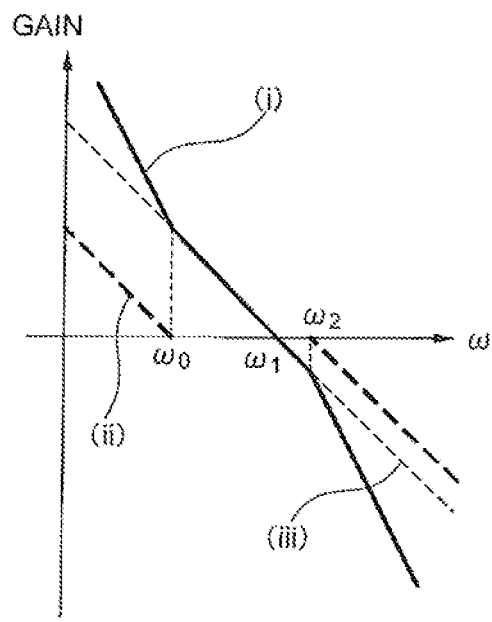
FIG. 13 is a graph showing the open-loop characteristic during the CAV reproduction on the inner periphery in the conventional PLL.
Figure 14:
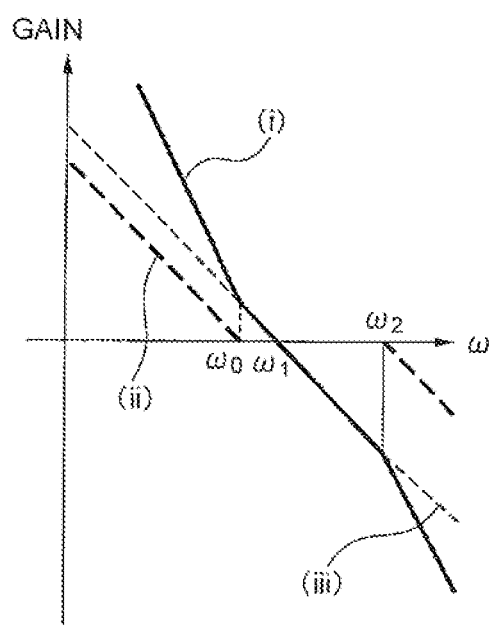
FIG. 14 is a graph showing the open-loop characteristic during the CAV reproduction on the outer periphery in the conventional PLL.

In the above formula (5), the first term is an integrator whereas the second term is a first-order low-pass-filter. Multiplication of this formula by the integration characteristic of VCO 105 provides the open-loop characteristic shown in FIG. 9, The second term is not limited to the first-order low-pass-filter, and may be merely $K_1$. In such a case however, a noise compression effect cannot be obtained in a high frequency range. Since the digital loop filter is a digital circuit that operates at any synchronizing clock, the frequency characteristic thereof depends on the clock frequency, whereby if the clock frequency is doubled, the frequency characteristic of the open-loop characteristic is shifted along the ω-axis by double.

In the present embodiment, the phase comparator 102 detects the polarity change timing of the digital signal from the digital signal train output from the A/D converter 101, to create the phase error signal based on the digital signal amplitude at that timing. Since the digital loop filter 103 is configured as a digital loop filter that operates on the synchronizing clock output from the VCO 105, the frequency characteristic of the filter as alone changes in proportion to the output clock frequency. In this case, the integration characteristic of the VCO 105 is not changed by the oscillation frequency. However, a value obtained by multiplying the output of phase comparator 102 by a product of the digital frequency value output from the digital loop filter 103 and a specific coefficient "A" is input to the digital filter 103, to change the gain in proportion to the output clock frequency, whereby the loop characteristic of the PLL as a whole can be linearly controlled depending on the output clock frequency. In addition, since the PLL circuit is configured by a digital circuit, there occurs neither a temperature-dependent change nor a variation with time, and a PLL having a smaller circuit scale and thus suited to incorporation to LSI can be realized.

The PLL circuit 100 of the present embodiment is effective in the case where the frequency of input signal changes by more than several tens of percent, as in the case of CAV reproduction from an optical disk that experiences a frequency difference of 2.4 times between the inner periphery and the outer periphery, and also effective to a disk drive other than for an optical disk. In addition, it is also effective, in addition to the CAV reproduction, to a CLV reproduction during a long seeking operation where data reproduction is needed before the spindle rotational speed is stabilized. The PLL circuit 100 can be used as a PLL for reproducing data from an optical disc or a magnetic disk in a disk drive (optical disk drive) including a data demodulator 109 that identifies the data from a digital readout signal, as in the present embodiment. Alternatively, it may be used as a PLL when a clock signal is generated from a wobble signal of an optical disk and used after frequency multiplication thereof.

Figure 5:
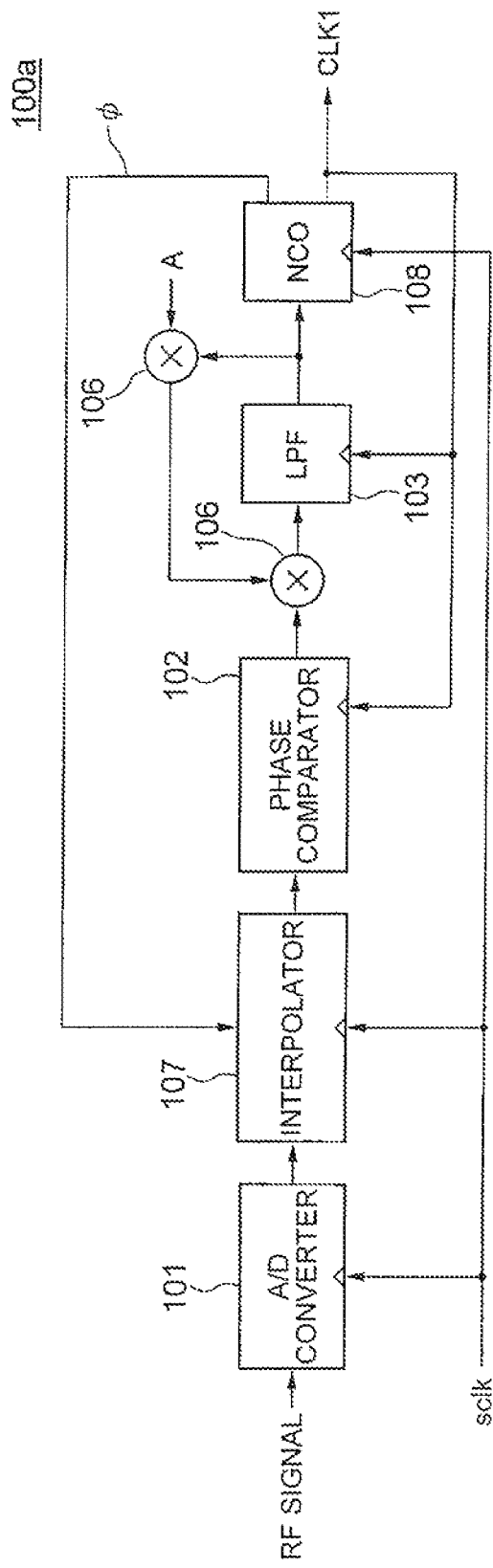
FIG. 5 is a block diagram showing the configuration of a digital PLL circuit according to a second embodiment of the present invention.

FIG. 5 shows the configuration of a PLL circuit according to a second embodiment of the present invention. There are three differences between the PLL circuit 100a of the present embodiment and the PLL circuit 100 (FIG. 1) of the first embodiment. The first difference is that an interpolator 107 is inserted between the A/D converter 101 and the phase comparator 102, whereby an interpolation phase control is performed using a numerically-controlled oscillator (NCO) 108. The second difference is that the A/D converter 101 and interpolator 107 operate based on a clock signal sclk that is not synchronized with the channel. The third difference is that the D/A converter is omitted herein. The PLL circuit 100a of the present embodiment is such that the PLL is digitized including the oscillator, thereby deleting variation with time and performance variation of the VCO.

The configuration of the phase comparator 102, digital loop filter 103, and multiplier 106 is similar to that in the PLL circuit 100 of the first embodiment. The A/D converter 101, interpolator 107, and UCO 108 are supplied with the clock signal sclk having a higher frequency than the channel clock. The frequency of the clock signal sclk is set, for example, at a frequency 10% higher than the channel frequency. The NCO 108 generates the synchronizing clock from the clock signal sclk based on the digital frequency value output from the digital loop filter 103. In addition, it generates interpolated phase information ($\phi_i$) that represents a phase error between the synchronizing clock CLK1 and the clock signal sclk.

The A/D converter 101 operates based on the clock signal sclk, and performs A/D conversion of the input signal. Since the frequency of clock signal sclk that is the operation clock for the A/D converter 101 is higher than the channel frequency, the A/D converter 101 performs the A/D conversion in an over-sampling. The interpolator 107 performs, for example, a linear interpolation based on the input data train from the A/D converter 101 and the interpolated phase information $\phi_i$ generated by the NCO 108, to generate a re-sampling signal equivalent to that sampled using the channel clock.

Figure 6:
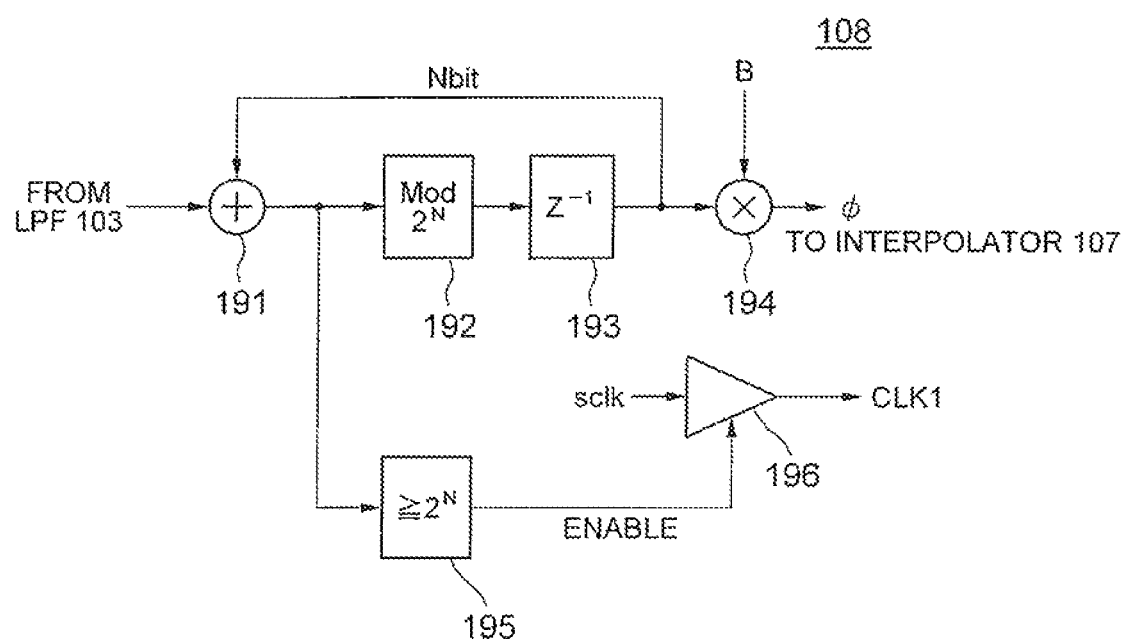
FIG. 6 is a block diagram showing the configuration of the NCO.

FIG. 6 shows an example of the configuration of NCO 108. The adder 191 adds the digital frequency value output from the digital loop filter 103 and the output of latch circuit 193, and delivers the same. Assuming that the latch circuit 193 has a N-bit bus width, and the digital frequency value has a N-bit or lower bus width, the data output from the adder 191 has a (N+1)-bit bus width. The output of the adder 191 is input to the modulo calculator 192 and comparator 195. The modulo calculator 192 outputs a remainder of output of the adder 191 divided by 2N. The latch circuit 193 operates in synchrony with the clock signal sclk, and delivers the remainder of division by 2N output from the modulo calculator 192 after delaying the same by one clock. The NCO 108 delivers, as the interpolated phase information, the output of latch circuit 193 multiplied by a fixed coefficient "B" in the multiplier 194. This interpolated phase information $\phi_i$ assumes a saw-tooth waveform signal, wherein the saw-tooth period changes in inverse proportion to the digital frequency value.

On the other hand, the comparator 195 compares the output of adder 191 against 2N, and raises the enable signal (ENABLE) to a H-level, if the output of adder 191 is higher than 2N. If the channel frequency is, for example, 90% of the frequency of clock signal sclk, the enable signal has a duty ratio of 90%. A gating cell 196 receives the clock signal sclk and the enable signal output from the comparator 195, to control the output of clock pulses of the clock signal sclk based on the enable signal. More specifically, the gating cell 196 delivers the clock pulses of the signal sclk as it is during a H-level period of the enable signal, and stops output of the clock pulses of the clock signal sclk during a L-level period of the enable signal. If the duty ratio of the enable signal is, for example, 90%, the gating cell 196 generates a gating clock wherein one of ten clock pulses is omitted, and delivers the same as the synchronizing clock CLK1.

Figure 7:
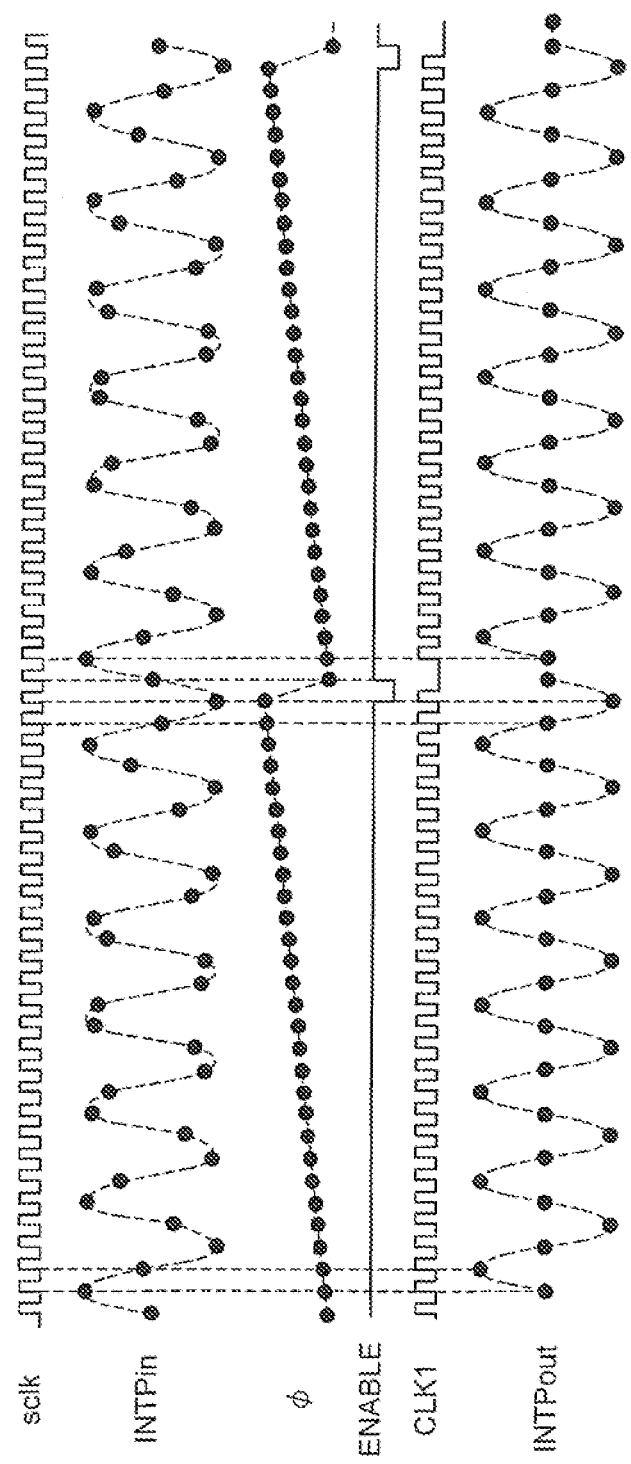
FIG. 7 is a waveform diagram showing the operation waveform of each section upon input of a signal including continued 2T-long mark/space signals.
Figure 8:
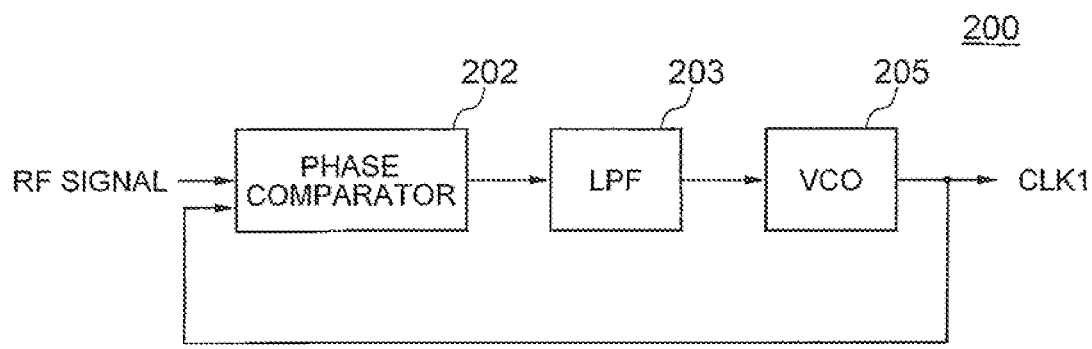
FIG. 8 is a block diagram showing the basic configuration of a typical PLL circuit.

FIG. 7 shows the operation waveform of each part of the PLL circuit 100a. The input signal includes continued 2T-long mark/space signals, and the signal output from this A/D converter 101 is sampled based on the clock signal sclk having a fixed frequency that is somewhat higher than the channel clock and thus not synchronized with the channel signal. The interpolated phase information $\phi_i$ output from the NCO 108 changes in the saw-tooth shape, and the enable signal ENABLE input to the gating cell 196 (FIG. 6) assumes a L-level at a discontinuous timing. The interpolator 107 receives the output signal of A/D converter 101 as an input signal (INTPin), estimates the output signal of A/D converter 101 at the timing of synchronizing with the synchronizing clock based on the values at two continuous sampling points and the interpolated phase information, and outputs the same as an output signal (INTPout) to the phase comparator 102. The interpolation function in the interpolator 101 need to be determined while taking into consideration the circuit scale and interpolation accuracy; however, it may be a linear function generally without incurring of any problem.

In the present embodiment as well, the gain of phase error output from the phase comparator 102 is adjusted using the digital frequency value output from the digital loop filter 103. In this way, the loop characteristic of the PLL as a whole is linearly controlled depending on the output clock frequency, as in the PLL circuit of the first embodiment. In the present embodiment, the PLL including the oscillator is digitized, thereby achieving, in addition to the advantage achieved by the first embodiment, suppression of variation with time and a performance variation that are the problems encountered with the use of VCO 105 (FIG. 1) that is an analog circuit.

As described heretofore, in the PLL circuit of each exemplary embodiment, the A/D converter that converts an analog signal into a digital signal, the phase comparator that generates a phase error between the analog signal and the synchronizing clock, the loop filter that generates a digital frequency value based on the phase error, and the oscillator that generates the synchronizing clock having a frequency corresponding to the digital frequency value configure a phase synchronization loop, and the phase comparator and loop filter are operated based on the synchronizing clock generated by the oscillator. In addition, the loop-gain control unit corrects the gain of phase error input to the loop filter based on the digital, frequency value output from the loop filter. In the present invention, by configuring the loop filter as a digital circuit and operating the loop filter based on the synchronizing clock output form the oscillator, the frequency characteristic of the filter as alone changes in proportion to the output clock frequency. Further, the phase error input to the loop filter is changed in proportion to the output clock frequency by the loop-gain control unit provided in the phase synchronization loop, whereby the loop characteristic can be linearly controlled depending on the output clock frequency. Further, since the PLL circuit is configured as a digital circuit, temperature-dependent change and variation with time can foe eliminated and the circuit scale can be reduced.

In the disk drive (optical disk drive) of the above exemplary embodiments, the loop filter is configured as a digital loop filter that operates based on the synchronizing clock output from the oscillator, and the loop-gain control unit corrects the gain of phase error input to the loop filter based on the digital frequency value output from the loop filter. In this way, the phase synchronization loop as a whole of the loop can be linearly controlled in the loop characteristic depending on the output clock frequency. Thus, the loop gain of the phase synchronization loop can be changed seamlessly in accordance with the change of the CAV linear velocity, and a suitable loop characteristic is realized for both the inner periphery and outer periphery of the disk, whereby stable information recording/reproducing can be achieved even during a CAV control.

As described in the above exemplary embodiments, the PLL circuit of the present invention can employ the following configurations.

A configuration may be employed wherein the digital phase comparator holds an output thereof at a timing other than an edge of the analog signal in the phase error signal generated at an edge timing. In the case where the input signal includes therein a variety of mixed frequencies, if an ordinary PLL is used for phase synchronization, the loop characteristic of the phase synchronization loop is changed depending on the frequency of phase comparison. By generating the phase error at an edge timing of the analog signal, and holding the output phase error signal at a timing other than the edge in the phase comparison result at the preceding edge by the phase comparator, the change of loop characteristic can be prevented.

A configuration may be employed wherein the digital phase comparator clears the held phase error signal generated at the edge timing if an edge of the analog signal is not detected for a specific time length. In the case where the input signal is interrupted due to any cause and the state of no edge being detected continues for a long time, if the phase error signal output form the phase comparator continues to be held in the phase comparison result for the latest edge, the phase error at the preceding edge is output for a long time, whereby the frequency of synchronizing clock may possibly deviate significantly from the frequency of the input signal. Clearance of the phase error signal held by the latch circuit if the edge is not detected for the specific time length can prevent such a problem.

A configuration may be employed wherein the loop-gain control unit includes a multiplier that multiplies the phase error signal output from the phase comparator by a value corresponding to the digital frequency value output from the digital loop filter to output the multiplied value to the digital loop filter. More specifically, a configuration may be employed wherein the loop-gain control unit multiplies the phase error signal output from the phase comparator by a product of the digital frequency value output, from the digital loop filter and a specific coefficient.

A configuration may be employed wherein the A/D converter performs, in synchrony with the synchronizing clock, A/D conversion of the analog signal into the digital signal. In the PLL circuit of the present invention, a configuration may be employed wherein the oscillator is configured as voltage controlled oscillator that oscillates on a frequency corresponding to an analog voltage value that is obtained by D/A conversion of the digital frequency value.

A configuration may be employed wherein the A/D converter includes an interpolator that operates in synchrony with a clock signal having a higher frequency than the synchronizing clock, estimates based on the digital signal output from the A/D converter a sampled value of the digital signal that is in synchrony with the synchronizing clock, and outputs the sampled value to the phase comparator. In this case, the A/D converter operates in synchrony with the clock signal having a higher frequency than the synchronizing clock, to thereby convert the input analog signal into a digital signal in an over-sampling. By estimating the digital signal value at the timing in synchrony with the output synchronizing clock, the A/D converter can output sampled values of the analog signal to the phase comparator at the timing in synchrony with the synchronizing clock.

A configuration may be employed wherein the oscillator is configured as a numerically-controlled oscillator that generates the synchronizing clock based on the digital frequency value from a clock signal having a higher frequency than the synchronizing clock, and delivers to the interpolator interpolated phase information relating to a phase difference between the clock signal and the synchronizing clock. In addition, by configuring the oscillator by a digital circuit, variation with time and performance variation of the oscillator can be suppressed. Further, by generating interpolated phase error information relating to the phase error between the clock signal and the synchronizing clock in the oscillator, and delivering the same to the interpolator, the interpolator can estimate the sampled values of the input analog signal from the digital signal that is not in synchrony with the synchronizing clock, based on the interpolated phase error information relating to the phase error between the clock signal and the synchronizing clock at the timing in synchrony with the synchronizing clock.

A configuration may be employed wherein the interpolator estimates the sampled value of the digital signal in synchrony with the synchronizing clock based on values of the digital signal sampled on at least two adjacent sampling points and output from the A/D converter and the interpolated phase information by using a specific interpolation function. In this case, a configuration may be employed wherein the rate of change (gradient) of the digital signal is obtained from the digital signal at, for example, two adjacent sampling points, the degree of intervals between the synchronized time point and the two sampling points is estimated from the interpolated phase information, and the sampled value of the input analog signal at the timing in synchrony with the synchronizing clock can be estimated depending on the deviation from the two sampling points.

While the invention has been particularly shown and described with reference to exemplary embodiment thereof, the invention is not limited to these embodiments and modifications. As will be apparent to those of ordinary skill in the art, various changes may be made in the invention without departing from the spirit and scope of the invention as defined in the appended claims.

The invention claimed is:

1. A PLL circuit that extracts a synchronizing clock from an analog signal in which a channel frequency changes, said PLL circuit comprising:
    a phase synchronization loop having a loop gain and comprising: an A/D converter that converts the analog signal into a digital signal; a digital phase comparator that operates in synchrony with the synchronizing clock to output a phase error signal between the analog signal and the synchronizing clock based on the digital signal output from said A/D converter; a digital loop filter that operates in synchrony with the synchronizing clock to output a digital frequency value proportional to the channel frequency based on the phase error signal; a D/A converter that converts said digital frequency value into an analog frequency signal and outputs the analog frequency signal; and an oscillator that outputs the synchronizing clock having a frequency controlled based on the digital frequency value; and
    a loop-gain control unit that controls the loop gain of said phase synchronization loop based on said digital frequency value which is converted into said analog frequency signal by said D/A converter,
    wherein said loop-gain control unit comprises a multiplier that multiplies the phase error signal output from said digital phase comparator by a value corresponding to the digital frequency value output from said digital loop filter to output the multiplied value to said digital loop filter, said multiplier being provided between an output side of the digital phase comparator and an input side of the digital loop filter.

2. The digital PLL circuit according to claim 1, wherein said digital phase comparator holds an output thereof at a timing other than an edge timing of the analog signal in the phase error signal generated at said edge timing.

3. The digital PLL circuit according to claim 2, wherein said digital phase comparator clears the held phase error signal generated at said edge timing if an edge of said analog signal is not detected for a specific time length.

4. The digital PLL circuit according to claim 1, wherein said loop-gain control unit multiplies the phase error signal output from said digital phase comparator by a product of the digital frequency value output from the digital loop filter and a specific coefficient.

5. The digital PLL circuit according to claim 1, wherein said A/D converter performs, in synchrony with the synchronizing clock, A/D conversion of the analog signal into the digital signal.

6. The digital PLL circuit according to claim 1, wherein said oscillator is a voltage controlled oscillator that oscillates on a frequency corresponding to an analog voltage value that is obtained by D/A conversion of the digital frequency value.

7. The digital PLL circuit according to claim 1, wherein said A/D converter includes an interpolator that operates in synchrony with a clock signal having a higher frequency than the synchronizing clock, estimates based on the digital signal output from said A/D converter a sampled value of the digital signal that is in synchrony with the synchronizing clock, and outputs the sampled value to said digital phase comparator.

8. The digital PLL circuit according to claim 7, wherein said oscillator is a numerically-controlled oscillator that generates the synchronizing clock based on the digital frequency value from a clock signal having a higher frequency than the synchronizing clock, and delivers to said interpolator interpolated phase information relating to a phase difference between the clock signal and the synchronizing clock.

9. The digital PLL circuit according to claim 8, wherein said interpolator estimates the sampled value of the digital signal in synchrony with the synchronizing clock based on values of the digital signal sampled on at least two adjacent sampling points and output from the A/D converter and the interpolated phase information by using a specific interpolation function.

10. A disk drive that reproduces data from a disk by using a CAV (constant angular velocity) control technique, comprising:
    a phase synchronization loop having a loop gain and comprising: an A/D converter that converts into a digital readout signal a readout signal obtained by reading information recorded on the disk; a digital phase comparator that operates based on a synchronizing clock extracted from the readout signal to output a phase error signal between the readout signal and the synchronizing clock based on the digital readout signal; a digital loop filter that operates based on the synchronizing clock to output a digital frequency value in proportion to a channel frequency of the readout signal based the phase error signal; a D/A converter that converts said digital frequency value into an analog frequency signal and outputs the analog frequency signal; and an oscillator that outputs the synchronizing clock having a frequency controlled based on the digital frequency value;
    a loop-gain control unit that controls the loop gain of said phase synchronization loop based on said digital frequency value which is converted into said analog frequency signal by said D/A converter; and
    a data demodulator that operates based on the synchronizing clock to identify data from the digital readout signal,
    wherein said loop-gain control unit comprises a multiplier that multiplies the phase error signal output from said digital phase comparator by a value corresponding to the digital frequency value output from said digital loop filter to output the multiplied value to said digital loop filter, said multiplier being provided between an output side of the digital phase comparator and an input side of the digital loop filter.

11. A disk drive that records data on an optical disk by using a CAV (constant angular velocity) control technique, comprising:
    a phase synchronization loop having a loop gain and comprising: an A/D converter that converts into a digital wobble signal a wobble signal that is read from the disk; a digital phase comparator that operates based on a clock extracted from the wobble signal to output a phase error signal between the wobble signal and a synchronizing clock based on the digital wobble signal; a digital loop filter that outputs a digital frequency value that is in proportion to a frequency of the wobble signal; a D/A converter that converts said digital frequency value into an analog frequency signal and outputs the analog frequency signal; and an oscillator that outputs the synchronizing clock having a frequency controlled based on the digital frequency value, said phase synchronization loop multiplying the clock signal to generate a recording clock; and
    a loop-gain control unit that controls the loop gain of said phase synchronization loop based on said digital frequency value which is converted into said analog frequency signal by said D/A converter,
    wherein said loop-gain control unit comprises a multiplier that multiplies the phase error signal output from said digital phase comparator by a value corresponding to the digital frequency value output from said digital loop filter to output the multiplied value to said digital loop filter, said multiplier being provided between an output side of the digital phase comparator and an input side of the digital loop filter.

* * * * *